United States Patent
Jo et al.

(10) Patent No.: US 7,737,033 B2
(45) Date of Patent: Jun. 15, 2010

(54) ETCHANT AND METHOD FOR FABRICATING ELECTRIC DEVICE INCLUDING THIN FILM TRANSISTOR USING THE SAME

(75) Inventors: Gyoo-Chul Jo, Yongin-si (KR); Kwang-Nam Kim, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 128 days.

(21) Appl. No.: 12/079,008

(22) Filed: Mar. 24, 2008

(65) Prior Publication Data
US 2009/0286360 A1  Nov. 19, 2009

(30) Foreign Application Priority Data
May 17, 2007  (KR) .................. 10-2007-0048182

(51) Int. Cl.
*H01L 21/44* (2006.01)
*C23F 1/00* (2006.01)

(52) U.S. Cl. .................. 438/669; 438/745; 438/754; 216/105; 216/109

(58) Field of Classification Search ......... 216/105–109; 438/669, 745, 754, 755
See application file for complete search history.

(56) References Cited

U.S. PATENT DOCUMENTS

| | | | |
|---|---|---|---|
| 2003/0107023 A1 | 6/2003 | Chae et al. | |
| 2003/0124851 A1 | 7/2003 | Jo et al. | |
| 2004/0262569 A1 | 12/2004 | Cho et al. | |
| 2005/0176604 A1* | 8/2005 | Lee et al. | 510/175 |
| 2006/0287208 A1* | 12/2006 | Lee et al. | 510/175 |

FOREIGN PATENT DOCUMENTS

| KR | 1020050000682 A | 1/2005 |
|---|---|---|
| KR | 2006-0099089 A | 9/2006 |

OTHER PUBLICATIONS

KR1020060099089, a machine translation of Korean Patent to Baik et al., Sep. 19, 2006.*
Extended European search report in 5 pages.

* cited by examiner

*Primary Examiner*—Kevin M Picardat
(74) *Attorney, Agent, or Firm*—Knobbe Martens Olson & Bear LLP

(57) ABSTRACT

The present embodiments relate to an etchant and a method of fabricating an electric device including a thin film transistor. The etchant includes a fluorine ion ($F^-$) source, hydrogen peroxide ($H_2O_2$), a sulfate, a phosphate, an azole-based compound, and a solvent. The etchant and method of fabricating an electric device including a thin film transistor, can etch a multi-layered film including copper layer, and a titanium or titanium alloy layer in a batch and can provide a thin film transistor having a good pattern profile at high yield. When reusing the etchant, uniform etching performance can be maintained with a long replacement period of the etchant, and therefore costs can be saved.

12 Claims, 24 Drawing Sheets

ETCHANT AND METHOD FOR FABRICATING ELECTRIC DEVICE INCLUDING THIN FILM TRANSISTOR USING THE SAME

CROSS-REFERENCE TO RELATED APPLICATION

This application claims priority to and the benefit of Korean Patent Application No. 10-2007-0048182 filed in the Korean Intellectual Property Office on May 17, 2007, the entire content of which is incorporated herein by reference.

BACKGROUND OF THE INVENTION

1. Field of the Invention

The present embodiments relate to an etchant and a method for fabricating an electric device including a thin film transistor using the same. More particularly, the present embodiments relate to an etchant that can provide a high quality display due to a high aperture ratio and high definition, and reduced register-capacitor signal delay (referred to as RC delay), and a method for fabricating an electric device including a thin film transistor using the same.

2. Description of the Related Art

In an active matrix liquid crystal display and an active matrix organic light emitting diode (OLED) display, a thin film transistor (TFT) is generally used as a switching device at each liquid crystal cell or each pixel.

Recently, there has been a tendency to increase the size of liquid crystal displays and organic light emitting diode (OLED) displays. Accordingly, there is a greater requirement for higher resolution. The larger liquid crystal displays and OLED displays with higher resolution necessarily require reduced RC delay. The reduced RC delay can be accomplished by minimizing resistance of wires.

In general, molybdenum (Mo) with resistivity of less than 12 $\mu\Omega$cm and aluminum (Al) with resistivity of less than 5.5 $\mu\Omega$cm are used as wire for a thin film transistor or an electrode. Since these metals have high resistivity, they tend to make it difficult to manufacture a larger liquid crystal display and OLED display with higher resolution. Accordingly, since copper (Cu) has resistivity of less than 2.2 $\mu\Omega$cm, it is being researched as an alternative wire and electrode.

However, copper can be applied to all of a gate electrode, a source electrode, and a drain electrode of a thin film transistor, but when it is applied to a gate electrode, it has poor adherence to a glass substrate where a thin film transistor is formed. In addition, when it is applied to a source electrode and a drain electrode, it may react with a silicon (Si) film that is used as a buffer. Therefore, when copper is applied to a gate electrode, a source electrode, and/or a drain electrode, it cannot be used as a single layer but is used as a copper/titanium or a copper/titanium alloy by disposing a barrier metal such as titanium (Ti) beneath it.

The copper/titanium or copper/titanium alloy is treated with a photolithography process and an etching process to form a wire and an electrode. A copper (Cu) layer as a first gate metal layer is deposited on a substrate. Then, a titanium (Ti) layer or a titanium alloy layer as a second gate metal layer is deposited on the first gate metal layer. Then, the second gate metal layer is selectively patterned to form a second gate pattern, and the first gate metal layer is selectively patterned to form a first gate pattern.

The patterning process of the first and second gate metal layers is included in an etching process. The first gate metal layer and the second gate metal layer are separately etched.

When copper/titanium or a copper/titanium alloy is not simultaneously but is separately etched, the fabrication process not only becomes complex, but also its yield rate may be deteriorated. The present embodiments overcome the above problems as well as provide additional advantages.

SUMMARY OF THE INVENTION

One embodiment provides an etchant that can minimize deterioration of etching performance according to an increase of the number of etched substrates when patterning a multi-layered film which can be a double layered film such as a copper layer/titanium layer or a copper layer/titanium alloy layer, or a triple-layered film such as titanium layer/copper layer/titanium layer or a titanium alloy layer/copper layer/titanium alloy layer, on a substrate, and thereby obtain a multi-layered film having a uniform pattern profile with a high yield reducing fabrication cost.

Another embodiment provides a method for fabricating an electric device including a thin film transistor using the above etchant.

According to one embodiment, provided is a etchant including a fluorine ion ($F^-$) source, hydrogen peroxide ($H_2O_2$), a sulfate, a phosphate, an azole-based compound, and a solvent.

The fluorine ion source is present at a concentration of 0.01 wt % to 10 wt %, the hydrogen peroxide is present at a concentration of 1 wt % to 20 wt %, the sulfate is present at a concentration of 0.1 wt % to 10 wt %, the phosphate is present at a concentration of 0.1 wt % to 10 wt %, the azole-based compound is present at a concentration of 0.01 wt % to 5 wt %, and the solvent is present in a balance amount.

The fluorine ion source is selected from the group consisting of hydrogen fluoride (HF), ammonium fluoride ($NH_4F$), ammonium hydrogen fluoride ($NH_4HF_2$), potassium fluoride (KF), sodium fluoride (NaF), and combinations thereof.

The sulfate is a compound of $A_2SO_4$, $AHSO_4$, $BSO_4$ and combinations thereof, where A is selected from the group consisting of an alkali metal, an ammonium ion ($NH_4^-$), and combinations thereof, and B is an alkaline-earth metal.

The phosphate is a compound of $D_xH_yPO_4$ where x and y are integers ranging from 0 to 3, x+y=3, and D is selected from the group consisting of an alkali metal, an alkaline-earth metal, ammonium ions ($NH_4^-$), and combinations thereof.

The azole-based compound is selected from the group consisting of alkylimidazole (where the alkyl is a C1 to C7 alkyl), pyrazole, tolyltriazole, benzotriazole, aminotetrazole, and combinations thereof.

The solvent is purified water or de-ionized water.

According to another embodiment, provided is a method of fabricating an electric device including a thin film transistor that includes forming a multi-layered film by depositing titanium (Ti) or a titanium alloy (Ti alloy), and copper (Cu); forming a selective mask by a photoresist method on the multi-layered film; and subjecting the masked multi-layered film to an etchant including a fluorine ion ($F^-$) source, hydrogen peroxide ($H_2O_2$), a sulfate, a phosphate, an azole-based compound, and a solvent to form a pattern.

The patterned multi-layered film can be used for a gate electrode of a thin film transistor.

Furthermore, the patterned multi-layered film can be used for a source or drain electrode of a thin film transistor.

The substrate including the thin film transistor can be used for a thin film transistor-liquid crystal display (LCD).

The substrate including the thin film transistor can also be used for an organic light emitting diode (OLED) display.

DETAILED DESCRIPTION OF THE EMBODIMENTS

Figure 1:
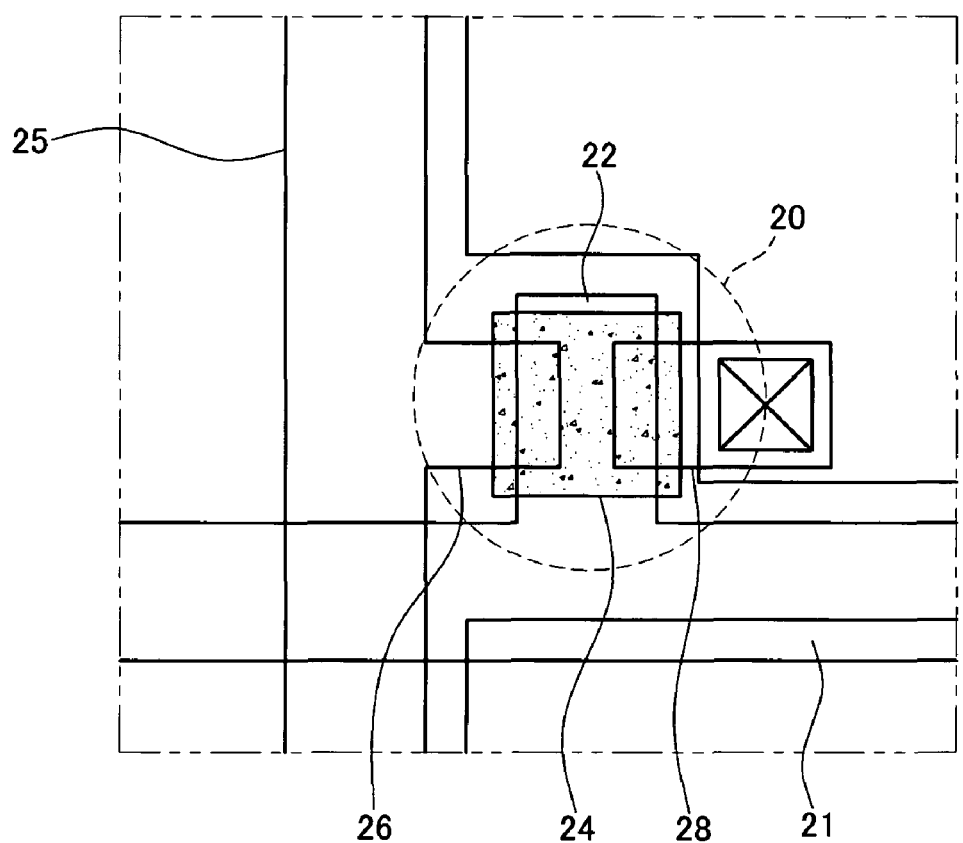
FIG. 1 is a partial enlarged view of a piece of electronic equipment including a general thin film transistor.

FIG. 1 is a partial enlarged view of a piece of electronic equipment, for example an organic light emitting diode (OLED) display including a general thin film transistor.

As shown in FIG. 1, the thin film transistor 20 includes a gate electrode 22 connected to a gate wire 21, a semiconductor layer 24 disposed on the gate electrode 22, a source electrode 26 connected to a data wire 25 on the semiconductor layer 24, and a drain electrode 28 spaced by a predetermined interval from the source electrode 26 on the semiconductor layer 24.

The gate electrode 22, source electrode 26, and drain electrode 28 can be made of a metallic material. In order to minimize signal delay caused by the metallic material of the gate electrode 22, source electrode 26, and drain electrode 28 of the thin film transistor 20, a multi-layered film including a copper layer, and a titanium or titanium alloy layer with low resistance should be applied.

A conventional etchant may cause critical dimension loss (CD-loss) of the copper/titanium or copper/titanium alloy layers depending on the number of etched substrates. In addition, the critical dimension loss (CD-loss) rate may not increase at a particular rate.

Therefore, the conventional etchant has a problem of not uniformly controlling a pattern profile of a multi-layered film including a copper layer, and a titanium or titanium alloy layer, and it also decreases the yield rate and increases fabrication cost since it needs to be frequently replaced.

According to one embodiment, an etchant is provided to etch the multi-layered film.

The etchant includes a fluorine ion (F$^-$) source; hydrogen peroxide (H$_2$O$_2$); a sulfate; a phosphate; an azole-based compound; and a solvent. The fluorine ion source is present at a concentration of from about 0.01 wt % to about 10 wt %, the hydrogen peroxide is present at a concentration of from about 1 wt % to about 20 wt %, the sulfate is present at a concentration of from about 0.1 wt % to about 10 wt %, the phosphate is present at a concentration of from about 0.1 wt % to about 10 wt %, the azole-based compound is present at a concentration of from about 0.01 wt % to about 5 wt %, and solvent is present in a balance amount.

The fluorine ions play a role of etching the titanium or titanium alloy layer as shown in Reaction Scheme 1:

$$Ti + 4HF = TiF_4 + H_2 \uparrow \quad \text{[Reaction Scheme 1]}$$

In Reaction Scheme 1, the titanium is easily reacted with the fluorine ions to produce titanium fluoride (TiF$_4$).

In this embodiment, the fluorine ion source is provided by a fluoride selected from at least one from the group consisting of ammonium fluoride (NH$_4$F), ammonium hydrogen fluoride (NH$_4$HF$_2$), potassium fluoride (KF), sodium fluoride (NaF), and combinations thereof as well as the above hydrogen fluoride (HF). The fluoride is dissociated in an aqueous solution to produce fluorine ions. When the fluorine ion source is present at a concentration within the above described range, the etch-rate of the titanium or titanium alloy can be sufficiently suppressed.

More preferably, the fluorine ion source is present at a concentration of from about 0.1 wt % to about 5 wt %.

The hydrogen peroxide plays a role of etching of the copper layer as shown in Reaction Schemes 2 and 3:

$$Cu + H_2O_2 = CuO + H_2O \quad \text{[Reaction Scheme 2]}$$

$$2Cu + H_2O_2 = 2CuO + H_2\uparrow \quad \text{[Reaction Scheme 3]}$$

As shown in Reaction Schemes 2 and 3, the oxygen of the hydrogen peroxide is reacted with copper to produce copper oxide (CuO), and water ($H_2O$) or hydrogen gas ($H_2$). The copper plays a role of producing the copper oxide. The hydrogen peroxide is present at a concentration of from about 1 wt % to about 20 wt %. When the hydrogen peroxide is present at a concentration within the above described range, the etch-rate of the copper can be sufficiently suppressed.

More preferably, the hydrogen peroxide is present at a concentration of from about 3 wt % to about 10 wt %.

The sulfate controls the etch-rate of the copper. The sulfate is used to suppress copper etching.

The sulfate can be a compound of, for example, $A_2SO_4$, $AHSO_4$, $BSO_4$ and combinations thereof, where A is an alkali metal such as, for example, potassium (K), sodium (Na), and combinations thereof; ammonium ($NH_4^+$); and combinations thereof, B is an alkaline-earth metal such as, for example, calcium (Ca), barium (Ba), and combinations thereof. Preferably, the sulfate is selected from the group consisting of $KHSO_4$, $NaHSO_4$, $CaSO_4$, $BaSO_4$, $(NH_4)HSO_4$, and combinations thereof. The sulfate is present at a concentration of from about 0.1 wt % to about 10 wt %. When the sulfate is present at a concentration within the above described range, the etch-rate of the copper can be sufficiently suppressed. More preferably, the sulfate is present at a concentration of from about 0.5 wt % to about 5 wt %.

The phosphate controls the etch-rate of the copper. As the concentration of the phosphate increases, the etch-rate of the copper increases.

The phosphate is represented by $D_xH_yPO_4$, wherein x and y are integers ranging from 0 to 3, wherein x+y=3, D is an alkali metal such as, for example, potassium (K), sodium (Na), and combinations thereof; an alkaline-earth metal such as, for example, calcium (Ca), barium (Ba), and combinations thereof, ammonium ($NH_4^+$); and combinations thereof. Preferably, the phosphate is selected from the group consisting of $K_2HPO_4$, $Na_2HPO_4$, $CaHPO_4$, $BaHPO_4$, $(NH_4)H_2PO_4$, $(NH_4)_3PO_4$, and combinations thereof. The phosphate is present at a concentration of from about 0.1 wt % to about 10 wt %. When the phosphate is present at a concentration within the above described range, the etch-rate of the copper can be sufficiently suppressed. More preferably, the phosphate is present at a concentration of from about 0.5 wt % to about 7 wt %.

The azole-based compound acts as a reaction inhibitor of copper (a Cu inhibitor).

The azole-based compound may be for example, an alkylimidazole such as methylimidazole ($C_4H_6N_2$) (where the alkyl is a $C_1$ to $C_7$ alkyl); pyrazole; tolyltriazole; benzotriazole; aminotetrazole; and combinations thereof. The azole-based compound is present at a concentration of from about 0.01 wt % to about 5 wt %. When the azole-based compound is present at a concentration within the above described range, the copper reaction and the etch-rate of the copper can be sufficiently suppressed. More preferably, the azole-based compound is present at a concentration of 0.5 wt % to 3 wt %.

The solvent can be purified water or de-ionized water.

Copper ions produced by the etchant do not perform a reaction, and thereby deterioration of etching performance can be minimized according to an increase of the number of etched substrates resulting in obtaining uniform pattern profiles of the multi-layered film at a high yield, and thereby cost can be reduced.

The multi-layered film has a structure in which a copper layer and a titanium or titanium alloy layer are multiply layered, and can be, for example, a double layer film of copper/titanium, a double layer film of copper/titanium alloy, a triple layer film of titanium/copper/titanium, a triple layer film of titanium alloy/copper/titanium alloy, and a quintuple layer film of titanium/titanium alloy/copper/titanium/titanium alloy.

The titanium alloy layer is a Ti-M alloy layer (wherein M is a transition metal such as Ni, etc.).

According to another embodiment, provided is a method of fabricating an electric device including a thin film transistor that includes forming a multi-layered film by depositing titanium (Ti) or a titanium alloy (Ti alloy), and depositing copper (Cu); forming a selective mask by a photoresist method on the multi-layered film; and subjecting the masked multi-layered film to an etchant including fluorine ions ($F^-$), hydrogen peroxide ($H_2O_2$), a sulfate, a phosphate, an azole-based compound, and a solvent to form a pattern.

FIGS. 2A to 2E show a fabrication process of a substrate according to one embodiment.

Figure 2A:
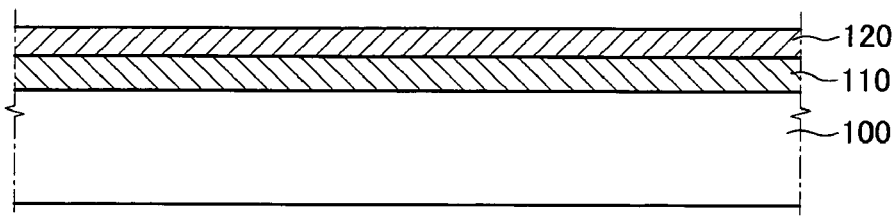
FIGS. 2A to 2E show a fabrication process of a substrate according to one embodiment.
Figure 2B:
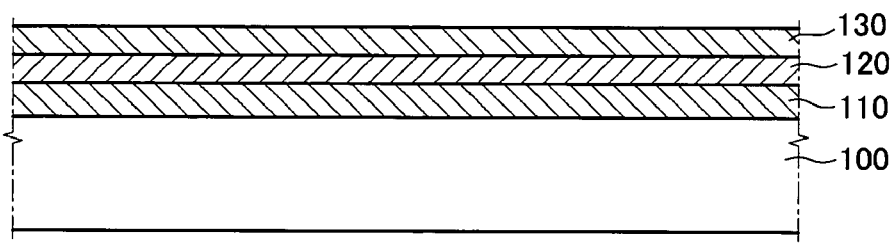

As shown in FIG. 2A, a titanium or titanium alloy layer 110 and a copper layer 120 are sequentially deposited on a substrate 100 in not less than 2 layers to form a multi-layered film. The titanium layer 110 improves a close-contacting property between the copper layer 120 having good conductivity and the substrate 100. Even though a gate electrode including the copper layer and titanium layer is described for better comprehension and ease of description, a gate electrode including a copper layer and a titanium alloy layer can also be applied.

The multi-layered film is the same as above.

The copper is formed at a thickness from about 1000 Å to about 10,000 Å, preferably at a thickness from about 2000 Å to about 5000 Å. When the copper layer has a thickness within the above described range, current is smoothly transferred and etching is easy.

The titanium or titanium alloy layer is formed at a thickness from about 10 Å to about 2000 Å, preferably from about 40 Å to about 700 Å. When the titanium or titanium alloy layer has a thickness within the above described range, uniform deposition thickness can be obtained, and upper layers on the titanium or titanium alloy layer are not required to be thick.

Figure 2C:
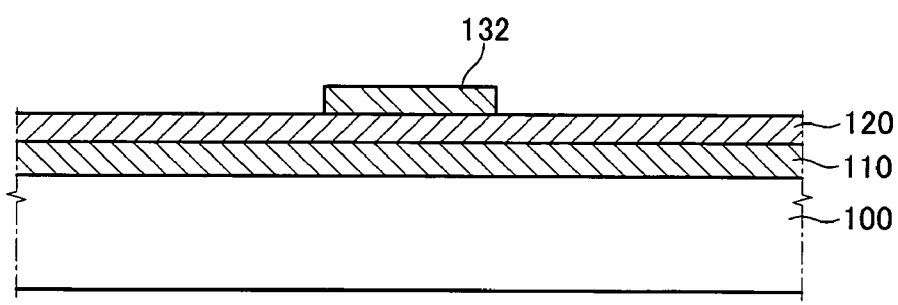

Subsequently, a photoresist 130 is applied on the entire upper surface of the multi-layered film disposed on the substrate 100 (FIG. 2B), and is subjected to selective exposure and development to form a photoresist pattern 132 for a gate electrode so as to protect the multi-layered film by masking it (FIG. 2C).

Figure 2D:
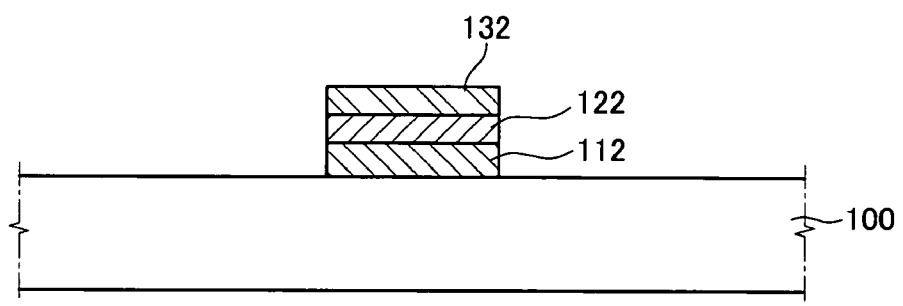

The masked multi-layered film is etched by the etchant (FIG. 2D). Herein, the etchant is the same as the above including the fluorine ions, hydrogen peroxide, sulfate, phosphate, and azole-based compound.

Figure 2E:
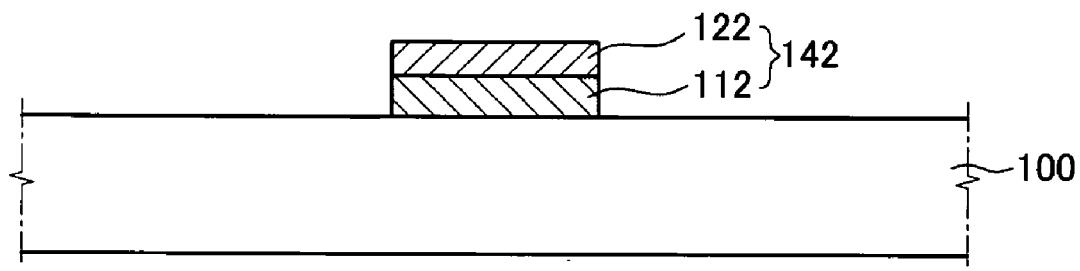

The photoresist pattern 132 that remains on the gate electrode is removed using a stripper to form a gate electrode 142 (FIG. 2E).

In the above description, formation of a gate electrode is described as an example, but the present embodiments are not limited thereto. The etching method can be applied to a source electrode and a data wire and/or a drain electrode as well as a gate electrode. Furthermore, it can be applied to all processes of pattern formation of a layer including a copper layer and a titanium or titanium alloy layer.

The method of fabricating an electric device including a thin film transistor can etch a multi-layered film in a batch by using the etchant having the above composition and therefore process steps of a thin film transistor can be reduced, resulting in improvement of productivity and reduction of cost and inferiority rate.

The fabricated thin film transistor can be applied to a thin film transistor-liquid crystal display (LCD) or organic light emitting diode (OLED) display. The connection structure of the thin film transistor and the above display devices and a method of fabricating the device are well known in the art to which the present embodiments pertain, and therefore their detailed descriptions are not provided.

The following examples illustrate the present embodiments in more detail. However, it is understood that the present embodiments are not limited by these examples.

Example 1

A 200 Å titanium layer was deposited on a glass substrate, and a 2000 Å copper layer was deposited thereon to form a double-layer. Then, a photoresist was coated on the glass substrate deposited with the double-layer in order. The resulting product was selectively exposed and developed to form a mask for etching on the layers. An etchant was prepared by dissolving 0.3 wt % of $NH_4F$, 6 wt % of $H_2O_2$, 3 wt % of $NaHSO_4$, 5 wt % of $(NH_4)H_2PO_4$, and 0.5 wt % of 5-aminotetrazole in de-ionized water. The 200 Å titanium and 2000 Å copper layers were etched together by using the etchant in a spray swing method. The etching was performed at 25° C.

Example 2

A 200 Å titanium layer was deposited on a glass substrate, and a 2000 Å copper layer was deposited thereon to form a double-layer. Then, a photoresist was coated on the glass substrate deposited with the double-layer in order. The resulting product was selectively exposed and developed to form a mask for etching on the double-layer. An etchant was prepared by dissolving 0.3 wt % of $NH_4F$, 6 wt % of $H_2O_2$, 5 wt % of $KHSO_4$, 3 wt % of $(NH_4)_3PO_4$, and 0.5 wt % of 5-aminotetrazole in de-ionized water. The double-layer was etched at one time by using the etchant in a spray swing method. The etching was performed at 25° C.

Example 3

A 500 Å titanium layer, a 4000 Å copper layer, and a 500 Å titanium layer were sequentially deposited on a glass substrate to form a triple-layer. Then, a photoresist was coated on the glass substrate deposited with the triple-layer in order. The resulting product was selectively exposed and developed to form a mask for etching on the triple-layer. An etchant was prepared by dissolving 0.8 wt % of HF, 10 wt % of $H_2O_2$, 1 wt % of $KHSO_4$, 2 wt % of $(NH_4)H_2PO_4$, and 0.1 wt % of 5-aminotetrazole in de-ionized water. The triple-layer was etched at one time by using the etchant in a spray swing method. The etching was performed at 30° C.

Example 4

A 500 Å titanium layer, a 4000 Å copper layer, and a 700 Å titanium layer were sequentially deposited on a glass substrate to form a triple-layer. Then, a photoresist was coated on the glass substrate deposited with the triple-layer in order. The resulting product was selectively exposed and developed to form a mask for etching on the triple-layer. An etchant was prepared by dissolving 0.8 wt % of HF, 10 wt % of $H_2O_2$, 1 wt % of $KHSO_4$, 2 wt % of $(NH_4)H_2PO_4$, and 0.1 wt % of 5-aminotetrazole in de-ionized water. The triple-layer was etched at one time by using the etchant in a spray swing method. The etching was performed at 30° C.

Example 5

A 500 Å titanium layer, a 40 Å Ti—Ni alloy layer, a 4000 Å copper layer, a 40 Å Ti—Ni alloy layer, and a 700 Å titanium layer were sequentially deposited on a glass substrate to form a quintuple-layer. Then, a photoresist was coated on the glass substrate deposited with the quintuple-layer in order. The resulting product was selectively exposed and developed to form a mask for etching on the quintuple-layer. An etchant was prepared by dissolving 1 wt % of HF, 10 wt % of $H_2O_2$, 1 wt % of $KHSO_4$, 2 wt % of $(NH_4)H_2PO_4$, 1 wt % of $NH_4HF_2$ and 0.1 wt % of 5-aminotetrazole in de-ionized water. The quintuple-layer was etched at one time by using the etchant in a spray swing method. The etching was performed at 30° C.

Examples 6 to 8

A 500 Å titanium layer, a 4000 Å copper layer, and a 500 Å titanium layer were sequentially deposited on a glass substrate to form a triple-layer. Then, a photoresist was coated on the glass substrate deposited with the triple-layer in order. The resulting product was selectively exposed and developed to form a mask for etching the triple-layer.

An etchant was prepared by dissolving HF, $H_2O_2$, $KHSO_4$, $(NH_4)H_2PO_4$, and 5-aminotetrazole in an amount according to the following Table 1 in de-ionized water. The triple-layer was etched at one time by using the etchant in a spray swing method. The etching was performed at 30° C.

Comparative Example 1

The triple-layer was etched with the method as in Example 6, except using an etchant that was prepared by dissolving 1 wt % of HF, 6 wt % of $H_2O_2$, 1 wt % of $(NH_4)H_2PO_4$, and 0.1 wt % of 5-aminotetrazole in de-ionized water as disclosed in Table 1, in a spray swing method. The etching was performed at 30° C.

TABLE 1

| | Etchant Composition | | | | |
| --- | --- | --- | --- | --- | --- |
| | HF | $H_2O_2$ | $KHSO_4$ | $(NH_4)H_2PO_4$ | 5-aminotetrazol |
| Comparative Example 1 | 1 | 6 | — | 1 | 0.1 |
| Example 6 | 1 | 6 | 1 | 1 | 0.1 |
| Example 7 | 1 | 6 | 2 | 1 | 0.1 |
| Example 8 | 1 | 6 | 5 | 1 | 0.1 |

The etching results of the multi-layered film of etchants according to Examples 1 to 5 such as etching time, degree of tapering, loss of critical dimension, edge sharpness, and change depending on time are provided in the following Table 2.

Referring to Table 2, "just-etching" indicates how long it took for a bare glass substrate to be exposed to an etchant for the first time, and "etching time" indicates how long it took to reach a desired pattern until the etching end.

The degree of tapering was determined by measuring the angle and length of the slope of copper and titanium layers with a field emission scanning electron microscope (FE-SEM).

The critical dimension loss (CD-loss) was determined by measuring how much line width was decreased when the over-etching was carried out to 60% beyond finishing.

In addition, the edge sharpness was determined by measuring the length of a tail formed when both edges of titanium and copper layers were dragged on the bottom, and "change depending on time" indicates the number of substrate sheets that can maintain an etching time measured by an end point detection system (EPD system) within ±10%, when several sheets of substrates are etched with the same etchant.

Cu/Ti layer when over-etching with respect to time by 43% according to Example 3 of the present embodiments.

Figure 7A:
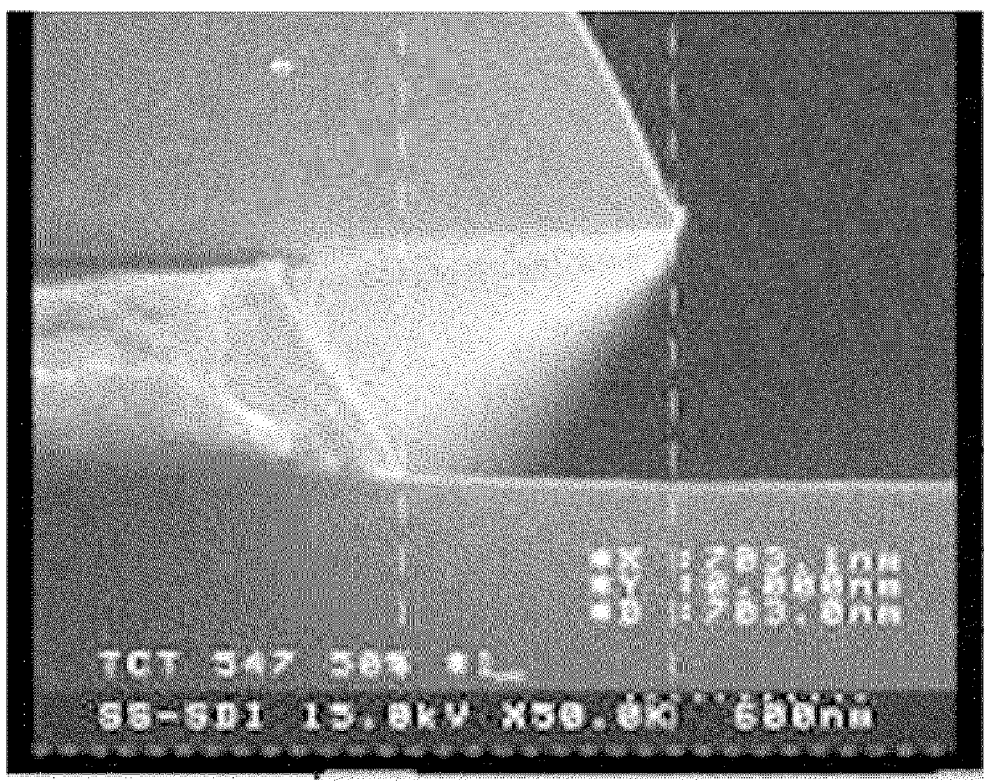
FIG. 7A is a photograph of pattern profiles of the photoresist when over-etching with respect to time by 60% according to Example 4 of the present embodiments.
Figure 7B:
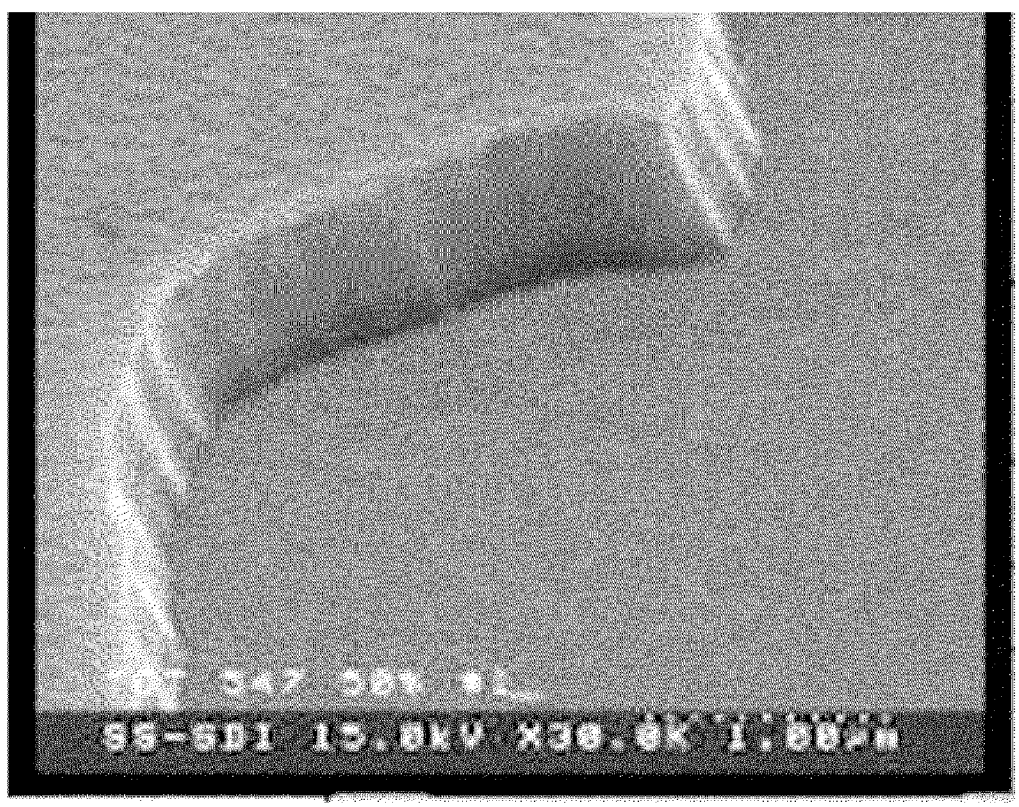
FIG. 7B is a photograph of a Cu/Ti layer when over-etching with respect to time by 60% according to Example 4 of the present embodiments.
Figure 7C:
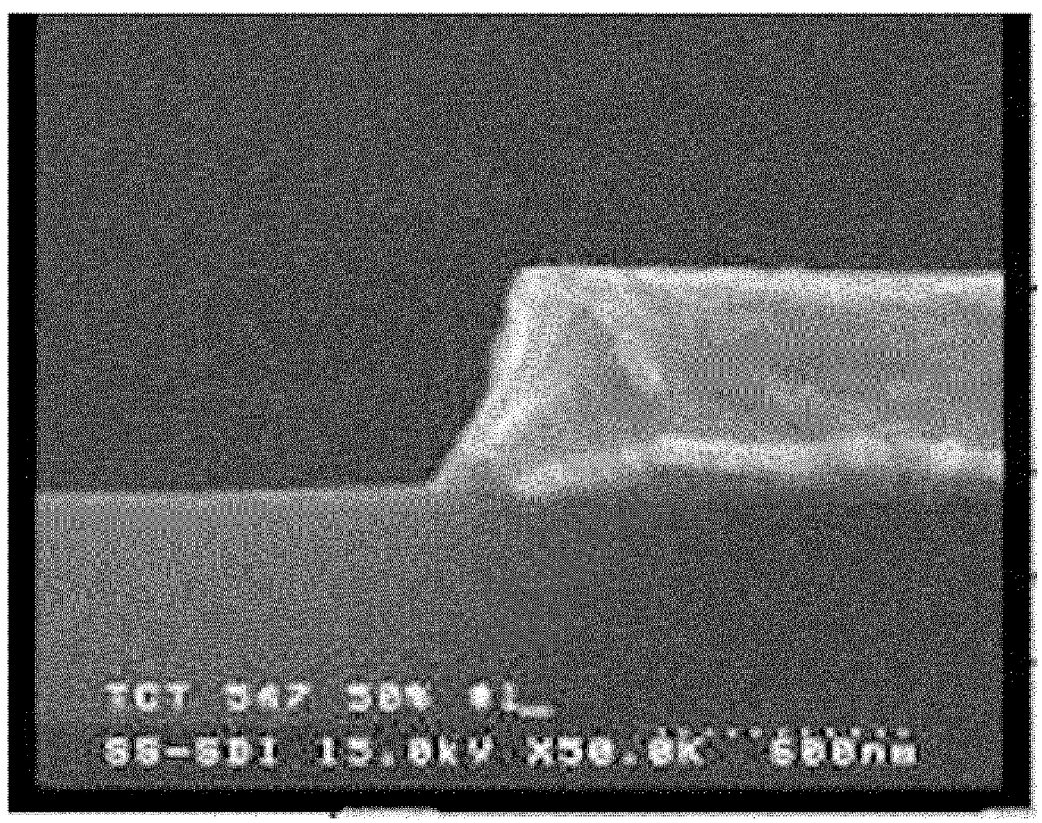
FIG. 7C is a cross-sectional views of a Cu/Ti layer when over-etching with respect to time by 60% according to Example 4 of the present embodiments.

FIG. 7A is a photograph of pattern profiles of the photoresist when over-etching with respect to time by 60% according to Example 4 of the present embodiments, FIG. 7B is a photograph of a Cu/Ti layer when over-etching with respect to time by 60% according to Example 4 of the present embodiments, and FIG. 7C is a cross-sectional views of a Cu/Ti layer when over-etching with respect to time by 60% according to Example 4 of the present embodiments.

TABLE 2

| [unit] | Etching Just etching [sec] | Etching time [sec] | Degree of tapering Angle [°] | Length [μm] | Loss of critical dimension (CD-loss) 60% Over etching [μm] | Edge sharpness Ti tail [Å] | Ti length [μm] | Cu length [μm] | Change depending on time Number of sheets of etched substrates [sheet] |
|---|---|---|---|---|---|---|---|---|---|
| Example 1 | 42 | 60 | 45 | 0.25 | 0.5 | ~100 | ~0.1 | ~0.1 | >1000 |
| Example 2 | 35 | 60 | 45 | 0.25 | 0.5 | ~100 | ~0.1 | ~0.1 | >600 |
| Example 3 | 60 | 80 | 60~70 | ~0.2 | 1.4 | 0 | <0.2 | <0.2 | — |
| Example 4 | 62 | 86 | 60~70 | ~0.2 | ~1.4 | 0 | <0.2 | <0.2 | — |
| Example 5 | 43 | 60 | 50 | ~0.2 | ~1.4 (at 40% over-etching) | 0 | <0.2 | <0.2 | — |

Referring to Table 2, it took 42 seconds and 35 seconds respectively for the bottom of the substrates of Examples 1 and 2 to be exposed, and 60 seconds for the etching to end. Their etching rates were all appropriate.

The tapering degree of the substrates of Examples 1 and 2 all had an angle of 45° with a length of 0.25 μm.

The edge sharpness of Examples 1 and 2 showed a tail height of less than 100 Å, and the titanium and copper layers had a length of less than 0.1 μm.

The pattern profiles of the multi-layered film etched by using the etchant according to Examples 1 to 5 was determined by measuring with a field emission scanning electron microscope (FE-SEM). The results are provided in FIGS. 3 to 8.

Figure 3A:
FIG. 3A is a photograph of pattern profiles of the photoresist when over-etching with respect to time by 30% according to Example 1 of the present embodiments.
Figure 3B:
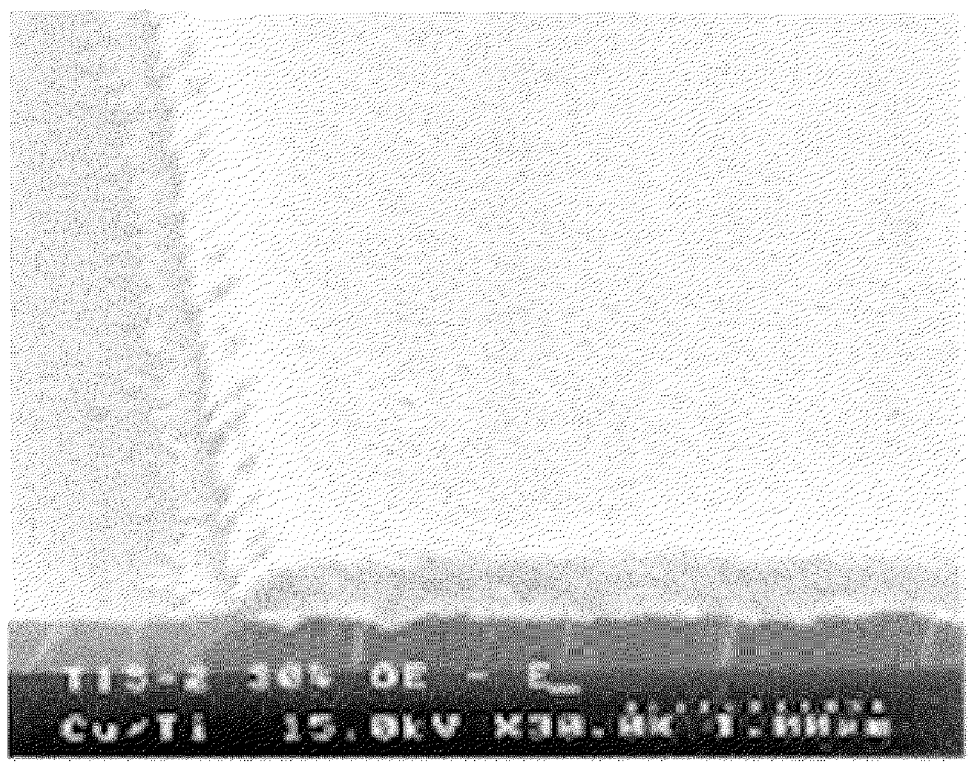
FIG. 3B is a photograph of a Cu/Ti layer when over-etching with respect to time by 30% according to Example 1 of the present embodiments.
Figure 3C:
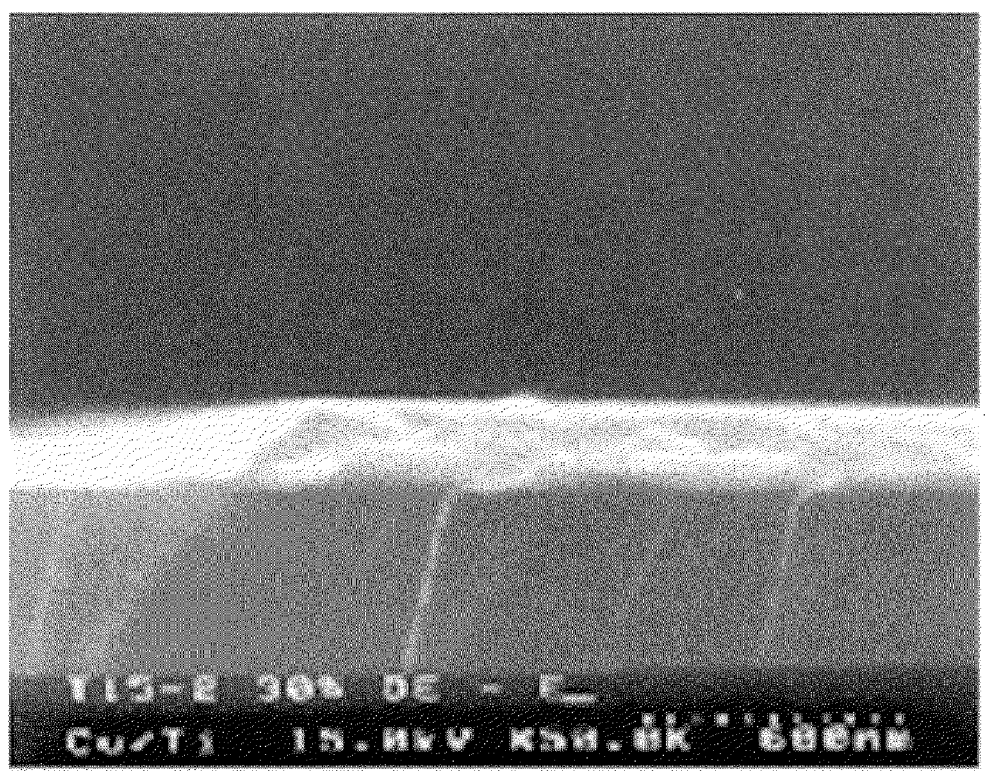
FIG. 3C is a cross-sectional views of a Cu/Ti layer when over-etching with respect to time by 30% according to Example 1 of the present embodiments.

FIG. 3A is a photograph of pattern profiles of the photoresist when over-etching with respect to time by 30% according to Example 1 of the present embodiments, FIG. 3B is a photograph of a Cu/Ti layer when over-etching with respect to time by 30% according to Example 1 of the present embodiments, and FIG. 3C is a cross-sectional views of a Cu/Ti layer when over-etching with respect to time by 30% according to Example 1 of the present embodiments.

Figure 4A:
FIG. 4A is a photograph of pattern profiles of the photoresist when over-etching with respect to time by 60% according to Example 1 of the present embodiments.
Figure 4B:
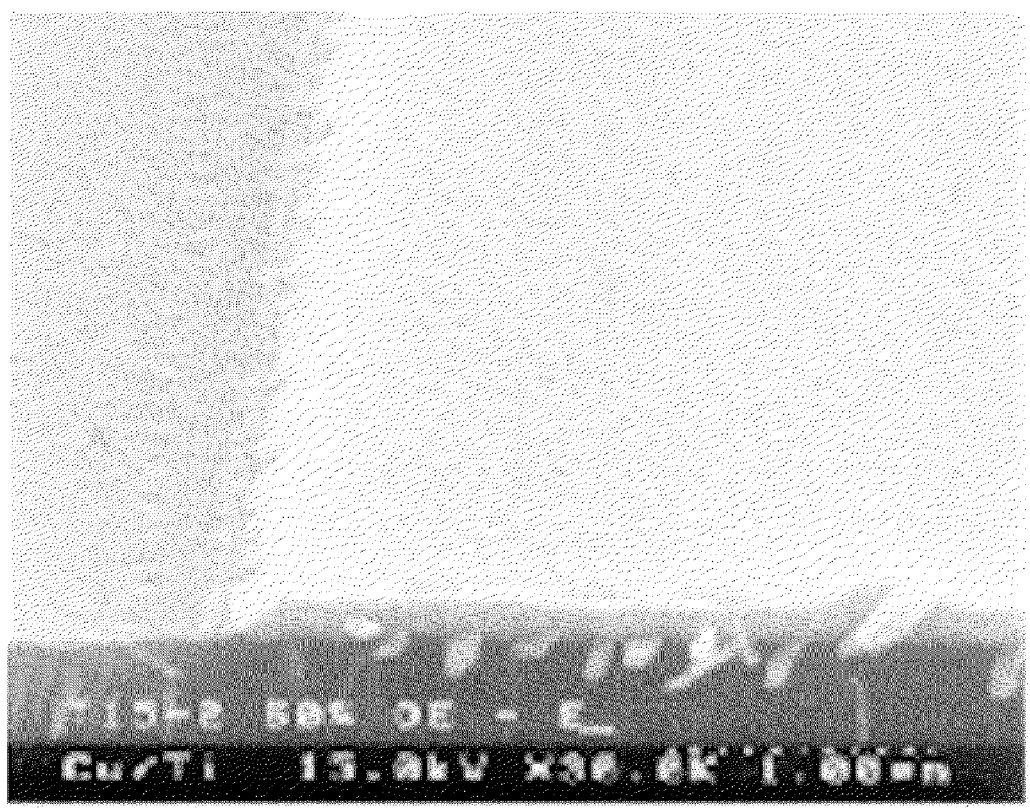
FIG. 4B is a photograph of a Cu/Ti layer when over-etching with respect to time by 60% according to Example 1 of the present embodiments.
Figure 4C:
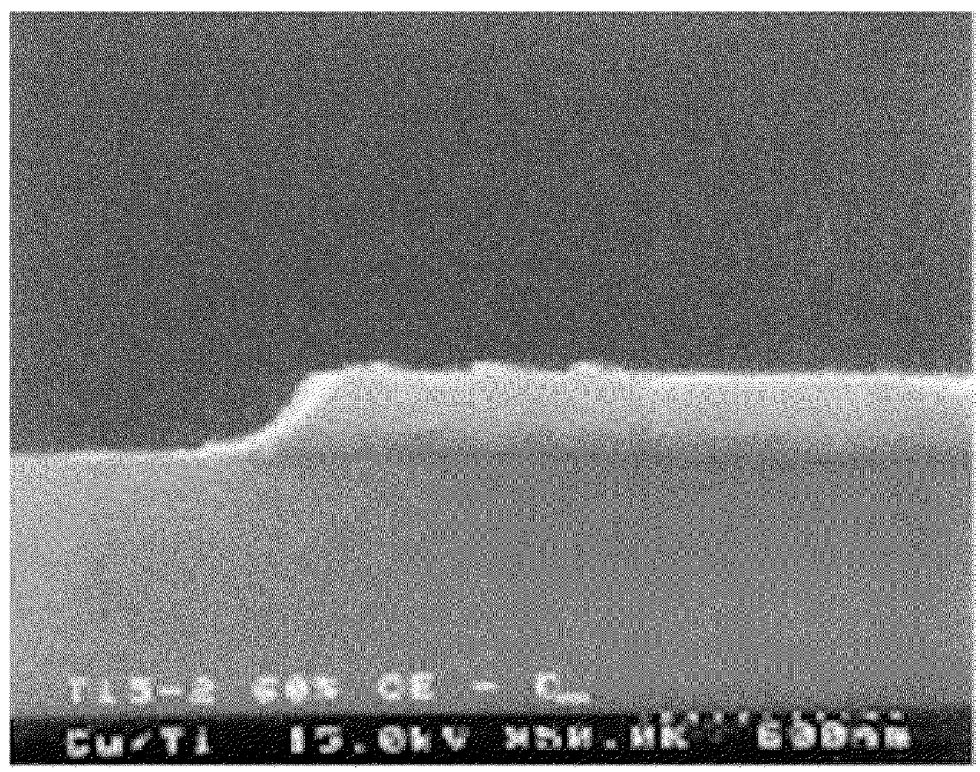
FIG. 4C is a cross-sectional views of a Cu/Ti layer when over-etching with respect to time by 60% according to Example 1 of the present embodiments.

FIG. 4A is a photograph of pattern profiles of the photoresist when over-etching with respect to time by 60% according to Example 1 of the present embodiments, FIG. 4B is a photograph of a Cu/Ti layer when over-etching with respect to time by 60% according to Example 1 of the present embodiments, and FIG. 4C is a cross-sectional views of a Cu/Ti layer when over-etching with respect to time by 60% according to Example 1 of the present embodiments.

Figure 5A:
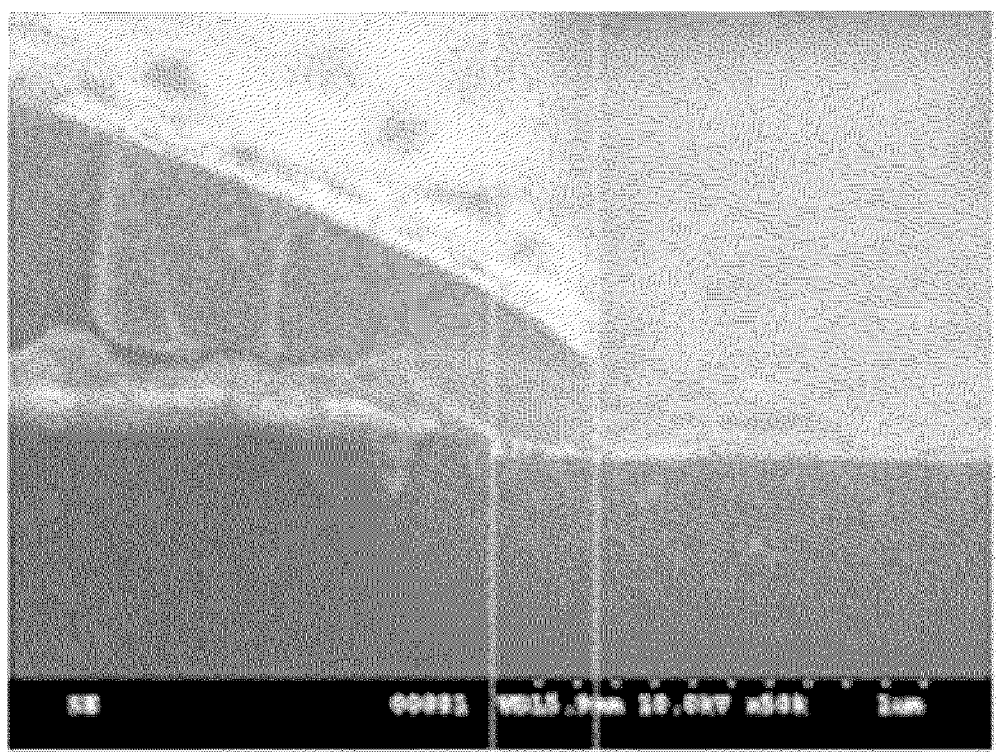
FIG. 5A is a photograph of pattern profiles of the photoresist when etching for 60 seconds according to Example 2 of the present embodiments.
Figure 5B:
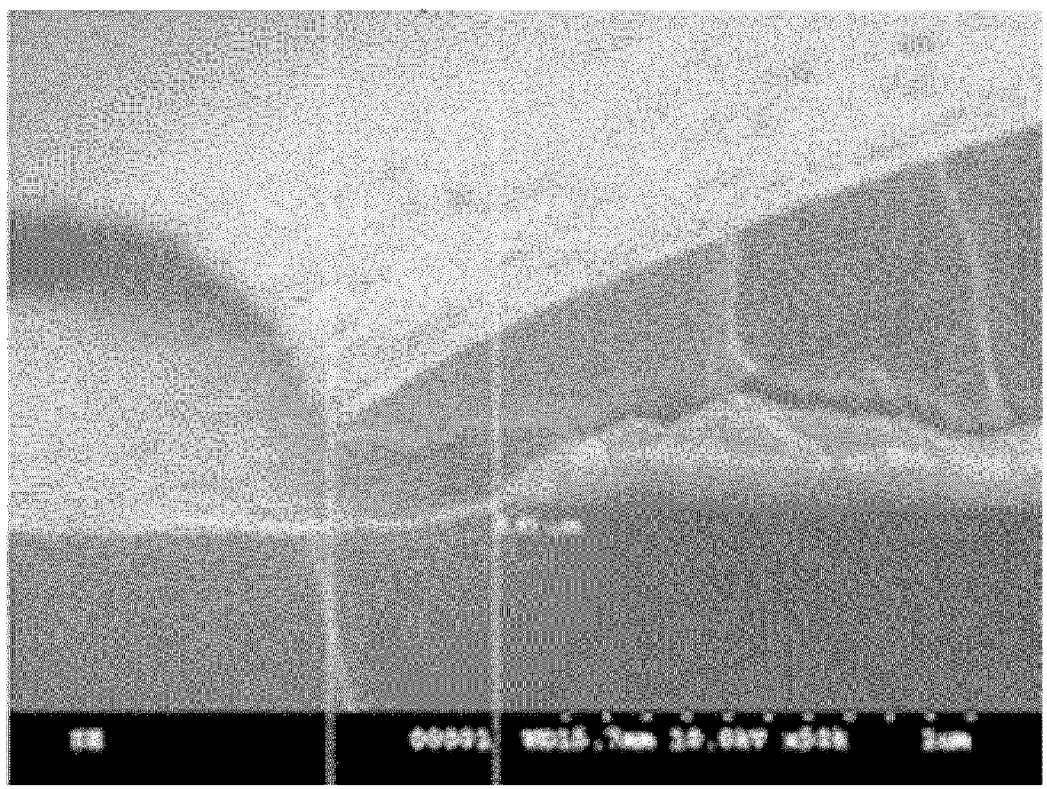
FIG. 5B is a photograph of pattern profiles of the photoresist when etching for 70 seconds according to Example 2 of the present embodiments.

FIG. 5A is a photograph of pattern profiles of the photoresist when etching for 60 seconds according to Example 2 of the present embodiments, and FIG. 5B is a photograph of pattern profiles of the photoresist when etching for 70 seconds according to Example 2 of the present embodiments.

Figure 6A:
FIG. 6A is a photograph of pattern profiles of the photoresist when over-etching with respect to time by 43% according to Example 3 of the present embodiments.
Figure 6B:
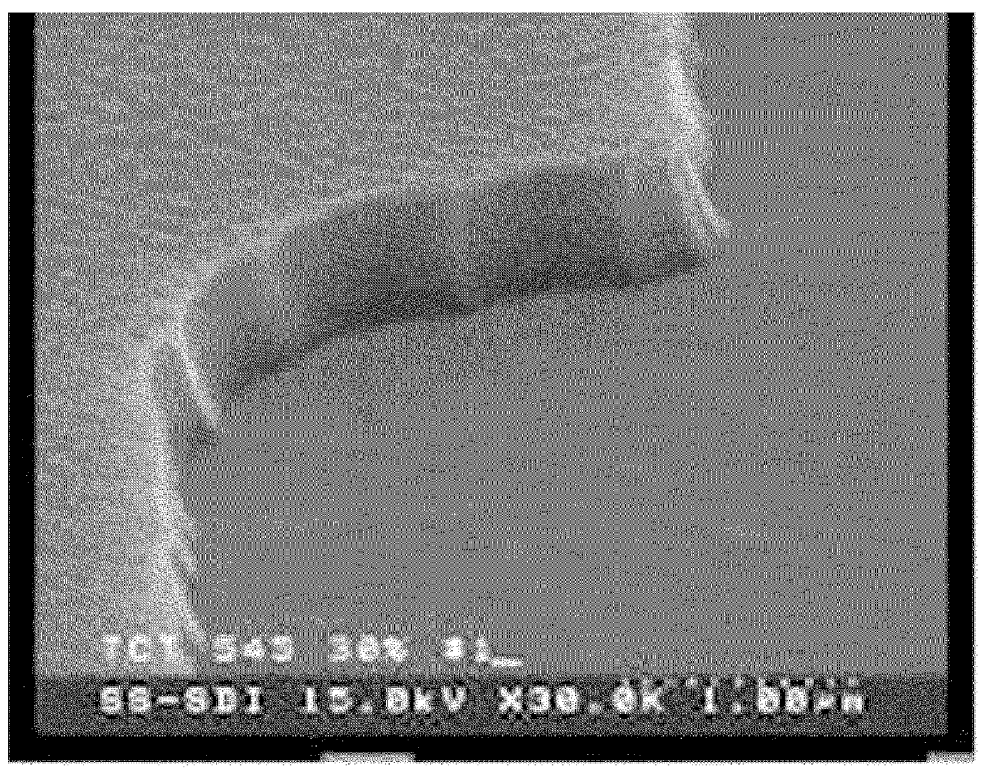
FIG. 6B is a photograph of a Cu/Ti layer when over-etching with respect to time by 43% according to Example 3 of the present embodiments.
Figure 6C:
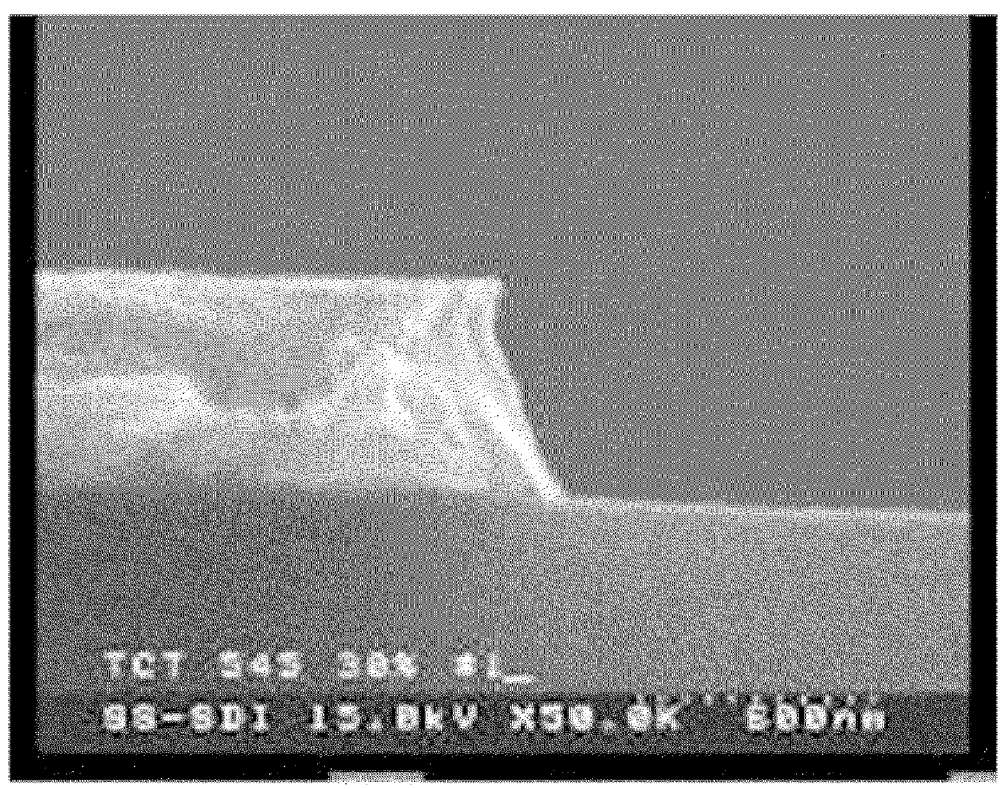
FIG. 6C is a cross-sectional views of a Cu/Ti layer when over-etching with respect to time by 43% according to Example 3 of the present embodiments.
Figure 8A:
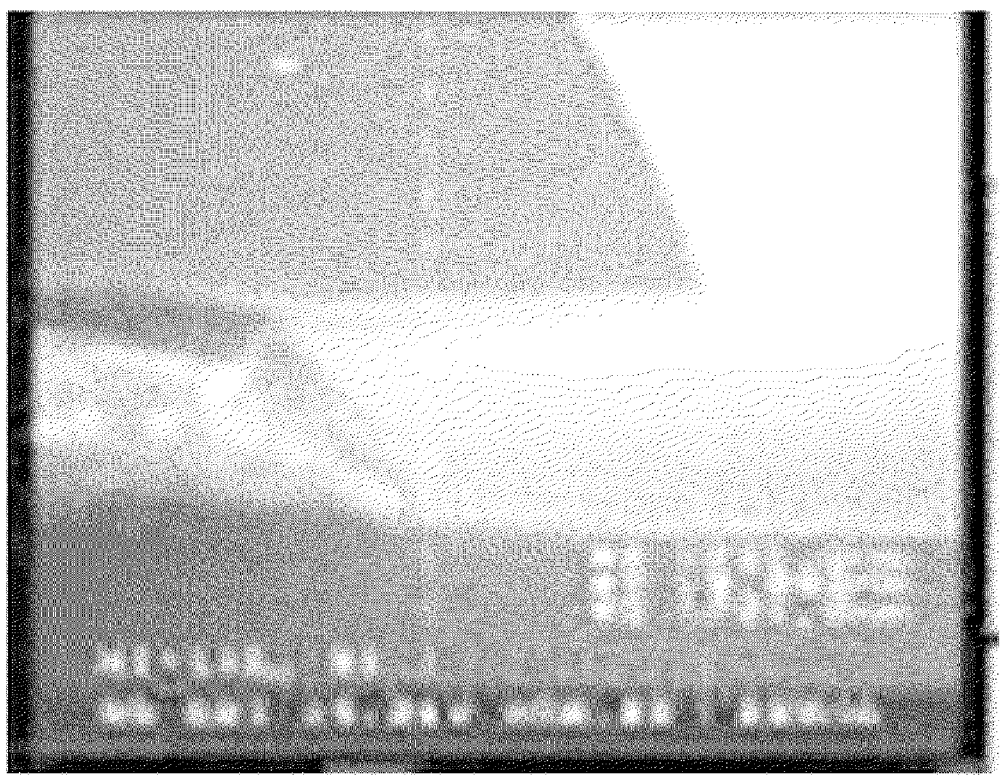
FIG. 8A is a photograph of pattern profiles of the photoresist when over-etching with respect to time by 40% according to Example 5 of the present embodiments.
Figure 8B:
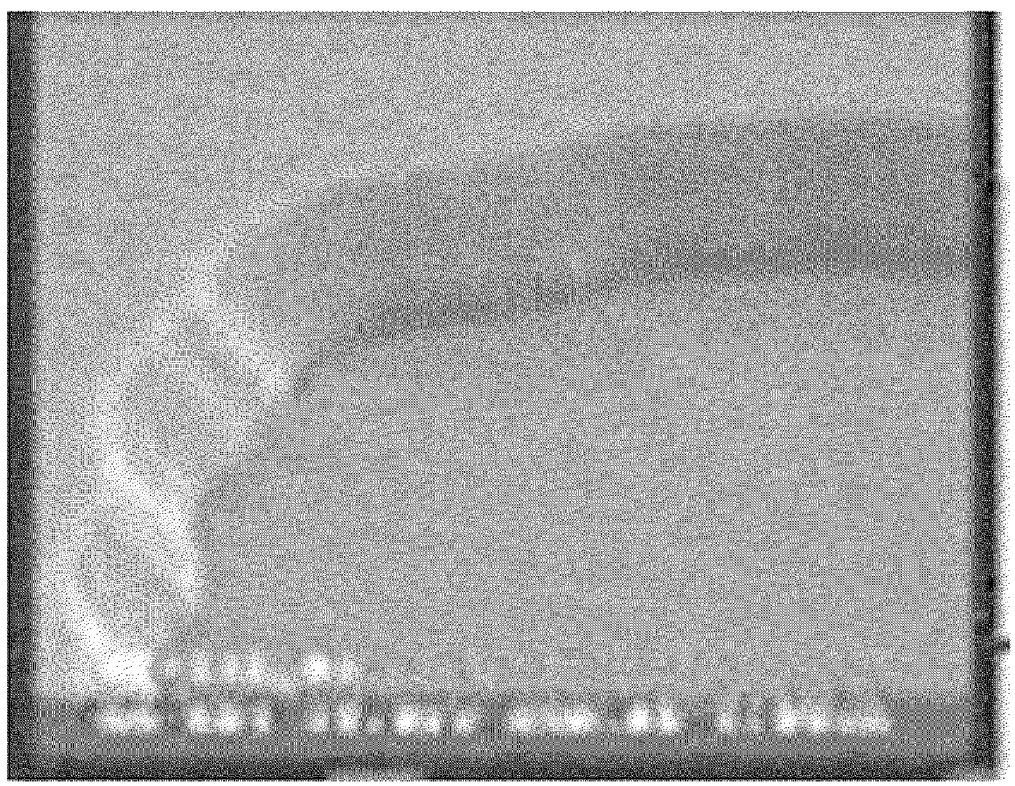
FIG. 8B is a photograph of a Cu/Ti layer when over-etching with respect to time by 40% according to Example 5 of the present embodiments.
Figure 8C:
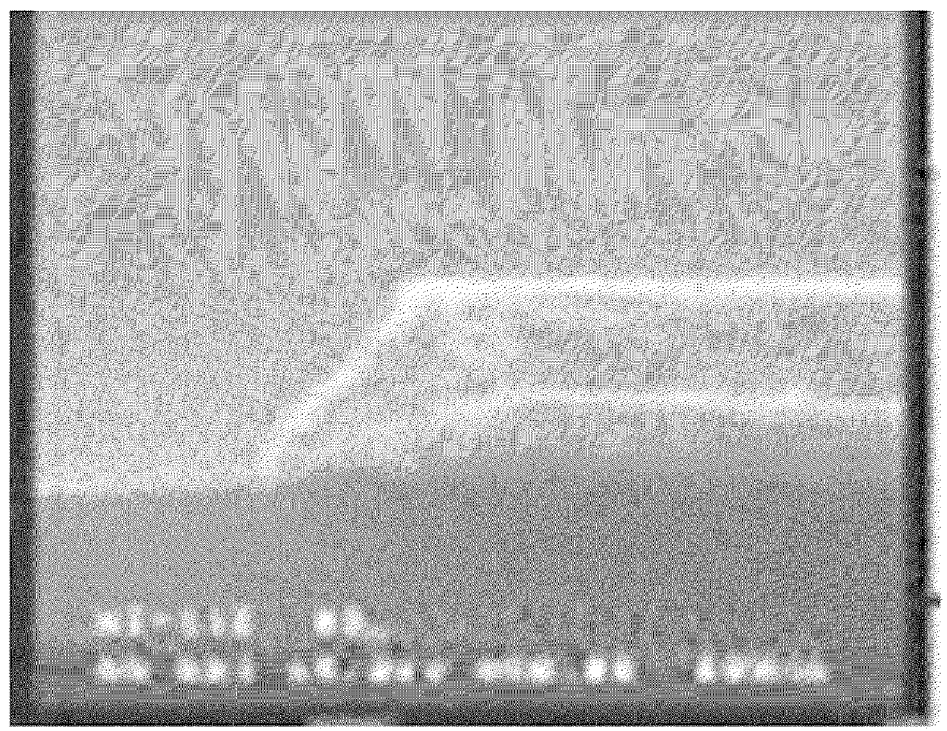
FIG. 8C is a cross-sectional views of a Cu/Ti layer when over-etching with respect to time by 60% according to Example 1 of the present embodiments.

FIG. 6A is a photograph of pattern profiles of the photoresist when over-etching with respect to time by 43% according to Example 3 of the present embodiments, FIG. 6B is a photograph of a Cu/Ti layer when over-etching with respect to time by 43% according to Example 3 of the present embodiments, and FIG. 6C is a cross-sectional views of a FIG. 8A is a photograph of pattern profiles of the photoresist when over-etching with respect to time by 40% according to Example 5 of the present embodiments, FIG. 8B is a photograph of a Cu/Ti layer when over-etching with respect to time by 40% according to Example 5 of the present embodiments, and FIG. 8C is a cross-sectional views of Cu/Ti layer when over-etching with respect to time by 60% according to Example 1 of the present embodiments.

As shown in FIG. 4 to 9, when Examples 1 to 5 were 60% over-etched, they had pattern width decrease of less than 0.5 μm; that is to say, a bigger process margin vs. etching time.

The critical dimension loss when over-etching was measured in order to evaluate the etching effect of etchants in Examples 3 and 4 to the multi-layered film. The results are provided in FIGS. 9 and 10.

Figure 9:
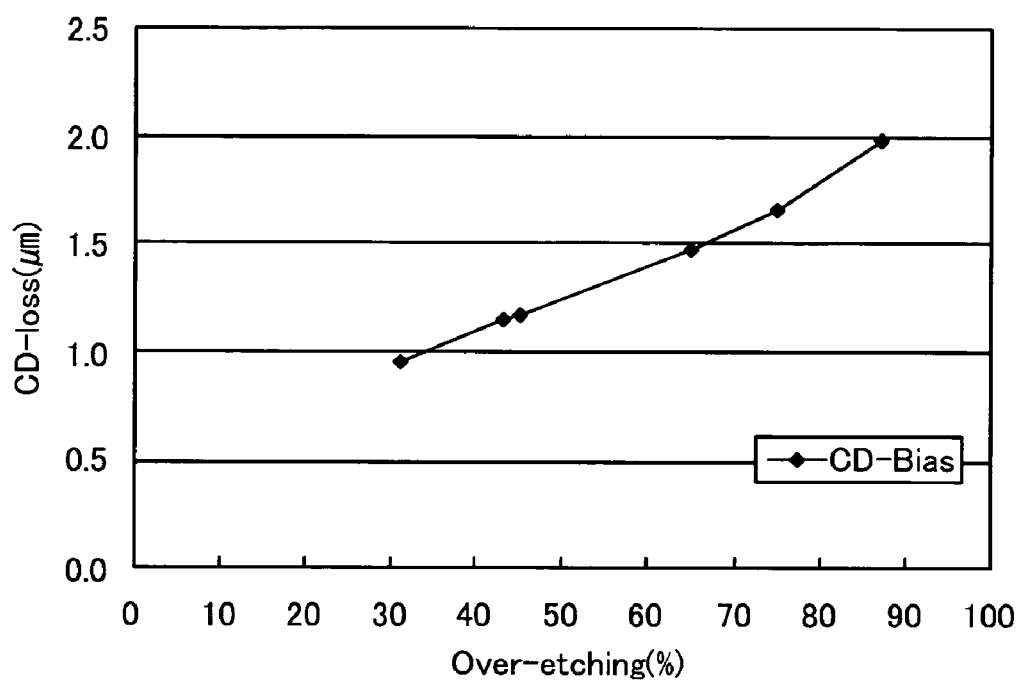
FIG. 9 is a graph of critical dimension loss when over-etching in Example 3 of the present embodiments.
Figure 10:
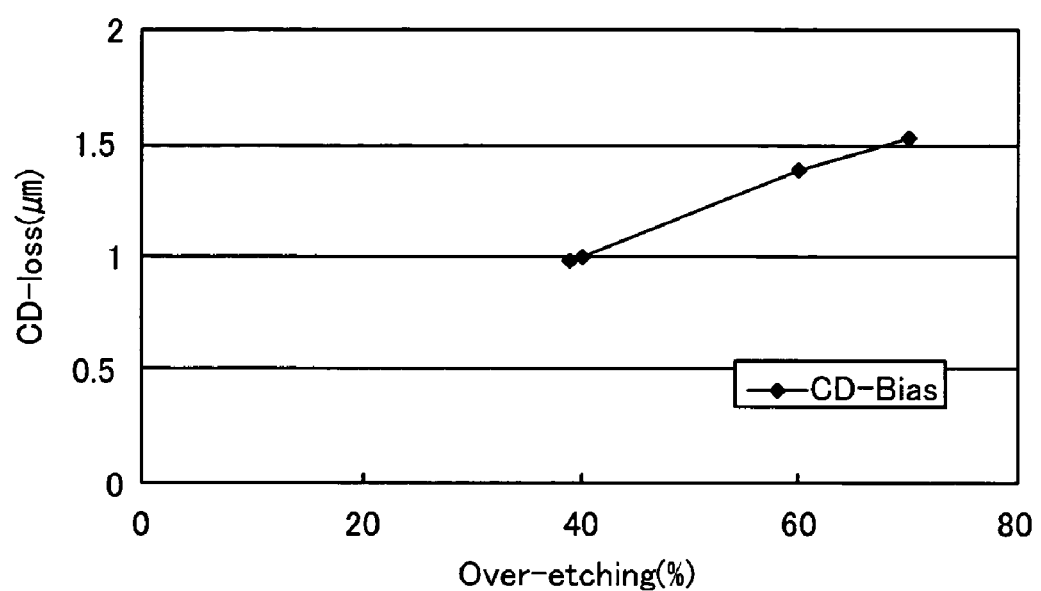
FIG. 10 is a graph of critical dimension loss when over-etching in Example 4 of the present embodiments.

FIG. 9 is a graph of critical dimension loss when over-etching in Example 3 of the present embodiments, and FIG. 10 is a graph of critical dimension loss when over-etching in Example 4 of the present embodiments.

As show in FIGS. 9 and 10, the critical dimension loss when over-etching was small in Examples 3 and 4.

Batch-etching results such as etching time and CD-loss of the Ti/Cu/Ti triple-layers according to Examples 6-8 and Comparative Example 1 are provided in the following Table 3.

TABLE 3

| | Etching Time [sec] | Loss of critical dimension (CD-loss) [μm] | | |
|---|---|---|---|---|
| | | 30% Over-etching | 60% Over-etching | 100% Over-etching |
| Comparative Example 1 | 80 | 0.338 | 0.501 | 0.908 |
| Example 6 | 50 | 0.327 | 0.511 | 0.679 |
| Example 7 | 40 | 0.161 | 0.401 | 0.833 |
| Example 8 | 25 | 0.425 | 0.871 | 1.295 |

As shown in Table 3, the etchants including a sulfate in Examples 6 to 8 have an equal etching effect of CD-Loss compared with that of the Comparative Example 1. However, when the Ti/Cu/Ti triple layer was etched by using the etchants including the sulfate in Examples 6 to 8, the etching time was shorter than that of Comparative Example 1. Also, as the content of the sulfate in the etchant increases, etching time decreases.

The etching process in Example 1 was repeated while continuously supplying the same kind of substrate. The etching time depending on the number of etched substrates according to Example 1 was measured, and the results are provided in FIG. 11.

Figure 11:
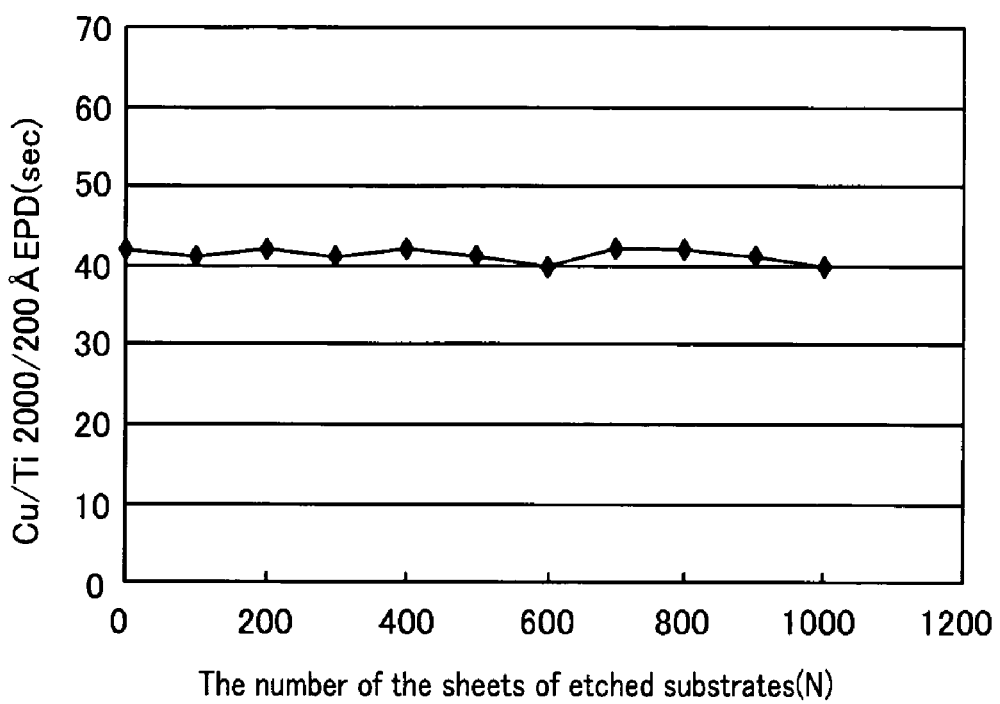
FIG. 11 is a graph showing etching time depending on the number of etched substrates according to Example 1 of the present embodiments.

FIG. 11 is a graph showing etching time depending on the number of etched substrates according to Example 1 of the present embodiments.

As shown in FIG. 11, the etchant of Example 1 was able to etch more than 1000 sheets of substrates by reusing the same etchant. Even when more than 1000 sheets of substrates deposited with a 2000 Å copper layer and a 200 Å titanium layer were etched, the etchant can still be used, securing a longer replacement period.

Figure 12:
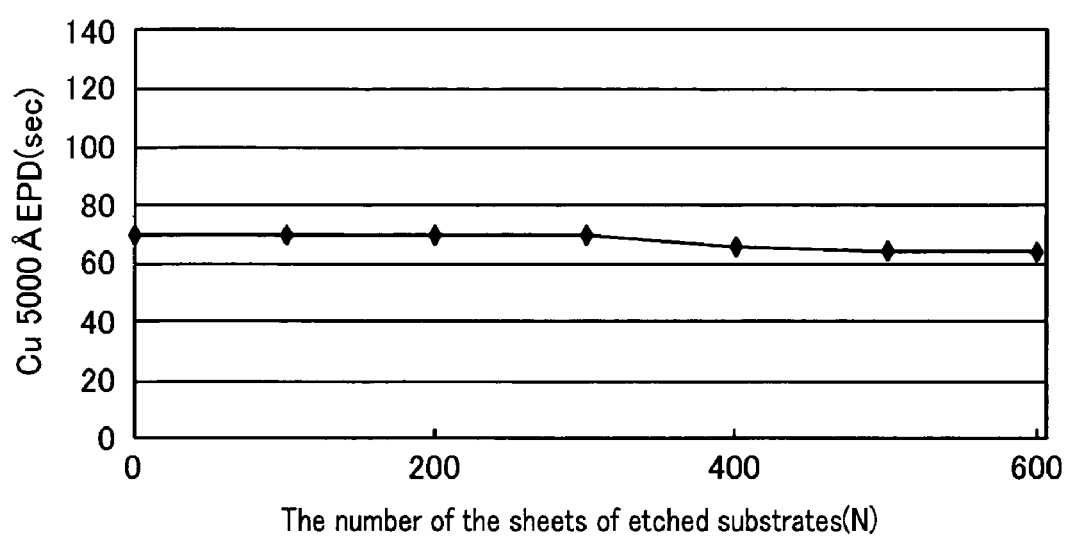
FIG. 12 is a graph showing etching time depending on the number of etched substrates according to Example 2 of the present embodiments.

The etching time depending on the number of etched substrates according to Example 2 was measured, and the results are provided in FIG. 12.

FIG. 12 is a graph showing etching time depending on the number of etched substrates according to Example 2 of the present embodiments.

As shown in FIG. 12, when an etchant according to Example 2 of the present embodiments was used to etch a 5000 Å copper layer, it maintained etching performance for more than 600 sheets. Based on this result, it can etch more than 1500 sheets when it is used to etch a 2000 Å copper layer, which is 2.5 times that of the 5000 Å copper layer. The present embodiments can solve unstable etching performance of copper and titanium layers as the number of etched substrates increases.

Therefore, an etchant and a method of fabricating an electric device with a thin film transistor according to the present embodiments can have an effect on prolonging use time of an etchant for etching a multi-layered film having a structure in which a copper layer and a titanium or titanium alloy layer are multiply layered, in a batch, thereby increasing yield rate by improving a pattern profile, and decreasing fabrication cost by maintaining uniform etching performance, when it is repeatedly used to etch sheets of substrates and thereby postponing its replacement period.

In addition, the etchant and the method of fabricating an electric device with a thin film transistor according to the present embodiments can simplify the application of copper with low resistance to an electronic device and thereby the electronic device can have improved characteristics such as high-aperture ratio, high-definition, and the like, and can also have reduced register-capacitor signal delay. Accordingly, it can be manufactured to be large-sized and have high quality.

While the present embodiments have been described in connection with what is presently considered to be practical exemplary embodiments, it is to be understood that the present embodiments are not limited to the disclosed embodiments, but, on the contrary, is intended to cover various modifications and equivalent arrangements included within the spirit and scope of the appended claims.

What is claimed is:

1. A method of fabricating an electric device comprising a thin film transistor substrate, comprising:
    forming a multi-layered film by depositing titanium (Ti) or a titanium alloy (Ti alloy), and copper (Cu);
    forming a selective mask by a photoresist method on the multi-layered film; and
    subjecting the masked multi-layered film to an etchant including a fluorine ion ($F^-$) source, hydrogen peroxide ($H_2O_2$), a sulfate, a phosphate, an azole-based compound, and a solvent to form a pattern;
    wherein the azole-based compound is selected from the group consisting of tolyltriazole and alkylimidazole wherein the alkyl is a $C_1$ to $C_7$ alkyl, and combinations thereof.

2. The method of claim 1, wherein the patterned multi-layered film is used for a gate electrode of a thin film transistor.

3. The method of claim 1, wherein the patterned multi-layered film is used for a source or drain electrode of a thin film transistor.

4. The method of claim 1, wherein the substrate including a thin film transistor is applied to a thin film transistor-liquid crystal display (LCD).

5. The method of claim 1, wherein the substrate including a thin film transistor is applied to an organic light emitting diode (OLED) display.

6. The method of claim 1, wherein the multi-layered film comprises a copper (Cu) layer, and a titanium (Ti) or titanium alloy layer.

7. An etchant comprising:
    a fluorine ion ($F^-$) source;
    hydrogen peroxide ($H_2O_2$);
    a sulfate;
    a phosphate;
    an azole-based compound; and
    a solvent
    wherein the azole-based compound is selected from the group consisting of tolyltriazole and alkylimidazole wherein the alkyl is a $C_1$ to $C_7$ alkyl, and combinations thereof;
    wherein the fluorine ion source is present at a concentration of from about 0.01 wt % to about 10 wt %, the hydrogen peroxide is present at a concentration of from about 1 wt % to about 20 wt %, the sulfate is present at a concentration of from about 0.1 wt % to about 10 wt %, the phosphate is present at a concentration of from about 0.1 wt % to about 10 wt %, the azole-based compound is present at a concentration of from about 0.01 wt % to about 5 wt %, and the solvent is present in a balance amount; and
    wherein the etchant etches a multi-layer comprising copper/titanium or a copper/titanium alloy.

8. The etchant of claim 7, wherein the fluorine ion ($F^-$) source is selected from the group consisting of hydrogen fluoride (HF), ammonium fluoride ($NH_4F$), ammonium hydrogen fluoride ($NH_4HF_2$), potassium fluoride (KF), sodium fluoride (NaF), and combinations thereof.

9. The etchant of claim 7, wherein the sulfate is a compound selected from of the group consisting of $A_2SO_4$, $AHSO_4$, $BSO_4$ and combinations thereof, wherein A is selected from the group consisting of an alkali metal, an ammonium ion ($NH_4^-$), and combinations thereof, and wherein B is an alkaline-earth metal.

10. The etchant of claim 7, wherein the phosphate is a compound of the formula $D_xH_yPO_4$ wherein x and y are integers from 0 to 3, wherein x+y=3, and wherein D is selected from the group consisting of an alkali metal, an alkaline-earth metal, an ammonium ion ($NH_4^-$), and combinations thereof.

11. The etchant of claim 7, wherein the solvent is purified water or de-ionized water.

12. The etchant of claim 7, wherein the multi-layered film comprises a copper (Cu) layer, and a titanium (Ti) or titanium alloy layer.

* * * * *